(12) United States Patent
Liu et al.

(10) Patent No.: US 11,671,056 B2
(45) Date of Patent: Jun. 6, 2023

(54) CRYSTAL OSCILLATOR AND PHASE NOISE REDUCTION METHOD THEREOF

(71) Applicant: MEDIATEK INC., Hsin-Chu (TW)

(72) Inventors: Sen-You Liu, Hsinchu (TW);
Chien-Wei Chen, Hsinchu (TW);
Keng-Meng Chang, Hsinchu (TW);
Yao-Chi Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/693,454

(22) Filed: Mar. 14, 2022

(65) Prior Publication Data

US 2022/0209714 A1 Jun. 30, 2022

Related U.S. Application Data

(63) Continuation of application No. 17/306,960, filed on May 4, 2021, now Pat. No. 11,309,835.

(Continued)

(51) Int. Cl.
*H03B 5/36* (2006.01)

(52) U.S. Cl.
CPC .............. *H03B 5/36* (2013.01); *H03B 5/362* (2013.01); *H03B 5/364* (2013.01); *H03B 2200/009* (2013.01)

(58) Field of Classification Search
CPC .......... H03B 5/36; H03B 5/362; H03B 5/364; H03B 2200/009

(Continued)

(56) References Cited

U.S. PATENT DOCUMENTS 4,319,204 A 3/1982 Weldon
4,704,587 A 11/1987 Ouyang
(Continued)

FOREIGN PATENT DOCUMENTS

CN 102332915 A 1/2012
CN 103891147 A 6/2014
(Continued)

OTHER PUBLICATIONS

Chen, the specification, including the claims, and drawings in the U.S. Appl. No. 17/695,863 , filed Mar. 16, 2022.
(Continued)

*Primary Examiner* — Arnold M Kinkead
(74) *Attorney, Agent, or Firm* — Winston Hsu (57) ABSTRACT

A crystal oscillator and a phase noise reduction method thereof are provided. The crystal oscillator may include a crystal oscillator core circuit, a first bias circuit and a phase noise reduction circuit, the first bias circuit is coupled to an output terminal of the crystal oscillator core circuit, and the phase noise reduction circuit is coupled to the output terminal of the crystal oscillator core circuit. In operations of the crystal oscillator, the crystal oscillator core circuit is configured to generate a sinusoidal wave. The first bias circuit is configured to provide a first voltage level to be a bias voltage of the sinusoidal wave. The phase noise reduction circuit is configured to reset the bias voltage of the sinusoidal wave in response to a voltage level of the sinusoidal wave exceeding a specific voltage range. For example, the specific voltage range is determined according to a second voltage level.

19 Claims, 9 Drawing Sheets

Related U.S. Application Data (60) Provisional application No. 63/070,347, filed on Aug. 26, 2020.

(58) Field of Classification Search
USPC ............ 331/158, 116 FE, 175, 183, 185, 74
See application file for complete search history.

(56) References Cited

U.S. PATENT DOCUMENTS

| | | | |
|---|---|---|---|
| 5,223,801 A | 6/1993 | Bergman | |
| 6,211,746 B1 | 4/2001 | Segawa | |
| 6,683,506 B2 | 1/2004 | Ye | |
| 7,126,432 B2 | 10/2006 | Roubadia | |
| 7,292,114 B2* | 11/2007 | Greenberg | H03L 5/00 331/116 R |
| 8,502,565 B2 | 8/2013 | Arnborg | |
| 9,407,201 B1 | 8/2016 | Iguchi | |
| 9,906,209 B2 | 2/2018 | Chang | |
| 10,840,897 B1 | 11/2020 | Rafi | |
| 11,309,835 B2* | 4/2022 | Liu | H03B 5/362 |
| 11,342,884 B2* | 5/2022 | Chen | H03K 19/21 |
| 2007/0013455 A1 | 1/2007 | Roubadia | |
| 2010/0244967 A1 | 9/2010 | Watanabe | |
| 2011/0241787 A1 | 10/2011 | Mastovich | |
| 2012/0126907 A1 | 5/2012 | Nakamoto | |
| 2014/0104009 A1 | 4/2014 | Lin | |
| 2016/0072497 A1 | 3/2016 | Paramanandam | |
| 2017/0170784 A1 | 6/2017 | Huang | |
| 2018/0109264 A1 | 4/2018 | Kim | |
| 2018/0159470 A1 | 6/2018 | Chen | |
| 2019/0044479 A1 | 2/2019 | Vijayaraghavan | |
| 2019/0109563 A1 | 4/2019 | Lin | |
| 2019/0312573 A1 | 10/2019 | Aouini | |
| 2020/0177128 A1 | 6/2020 | Ciubotaru | |
| 2020/0204115 A1 | 6/2020 | Ahmed | |
| 2020/0235702 A1 | 7/2020 | Kumar | |

FOREIGN PATENT DOCUMENTS

| | | |
|---|---|---|
| CN | 106656173 A | 5/2017 |
| CN | 109155610 A | 1/2019 |

OTHER PUBLICATIONS

Jerry Lin, "A Low-Phase-Noise 0.004-ppm/Step DCXO With Guaranteed Monotonicity in the 90-nm CMOS Process", JSSC , Dec. 2005, IEEE, USA.

Chen, the specification, including the claims, and drawings in the U.S. Appl. No. 17/306,959 , filed May 4, 2021.

J. Borremans et al., "A Low-Complexity, Low Phase Noise, Low-Voltage Phase-Aligned Ring Oscillator in 90 nm Digital CMOS", ESSCIRC 2008—34th European Solid-State Circuits Conference, 2008 IEEE, UK, pp. 410-413. ,2008.

* cited by examiner

CRYSTAL OSCILLATOR AND PHASE NOISE REDUCTION METHOD THEREOF

CROSS REFERENCE TO RELATED APPLICATION

This application is a continuation application of U.S. application Ser. No. 17/306,960, filed on May 4, 2021, which claims the benefit of U.S. Provisional Application No. 63/070,347, filed on Aug. 26, 2020. The contents of these applications are incorporated herein by reference.

BACKGROUND

The present invention is related to crystal oscillators, and more particularly, to a crystal oscillator and a phase noise reduction method thereof.

For an electronic system such as a phase-locked loop, a reference clock is required. More particularly, phase noise of the reference clock severely impact overall performance of the electronic system, and phase noise related performance is therefore demanding. In general, the reference clock can be generated by a crystal oscillator such as a Pierce oscillator or a Colpitts oscillator. Proposed methods and related architecture in a related art greatly increase additional circuits to improve overall performance of the crystal oscillator (e.g. reduce phase noise thereof). Thus, there is a need for a novel architecture and related method, to reduce phase noise of the crystal oscillator (more particularly, to reduce the phase noise of the reference clock) without introducing any side effect or in a way that is less likely to introduce side effects.

SUMMARY

This in mind, an objective of the present invention is to provide a crystal oscillator and a phase noise reduction method thereof, to improve phase noise related performance of an electronic system, and more particularly, to reduce phase noise of a reference clock output from a crystal oscillator of the electronic system.

At least one embodiment of the present invention provides a crystal oscillator. The crystal oscillator may comprise a crystal oscillator core circuit, a first bias circuit and a phase noise reduction circuit, where the first bias circuit is coupled to an output terminal of the crystal oscillator core circuit, and the phase noise reduction circuit is coupled to the output terminal of the crystal oscillator core circuit. In operations of the crystal oscillator, the crystal oscillator core circuit is configured to generate a sinusoidal wave. The first bias circuit, configured to provide a first voltage level to be a bias voltage of the sinusoidal wave. The phase noise reduction circuit is configured to reset the bias voltage of the sinusoidal wave in response to a voltage level of the sinusoidal wave exceeding a specific voltage range. For example, the phase noise reduction circuit may comprises a second bias circuit configured to control a second voltage level, wherein the specific voltage range is determined according to the second voltage level.

At least one embodiment of the present invention provides a phase noise reduction method of a crystal oscillator. The phase noise reduction method may comprise: generating a sinusoidal wave by a crystal oscillator core circuit of the crystal oscillator; providing a first voltage level to be a bias voltage of the sinusoidal wave by a first bias circuit of the crystal oscillator; and resetting the bias voltage of the sinusoidal wave by a phase noise reduction circuit of the crystal oscillator in response to a voltage level of the sinusoidal wave exceeding a specific voltage range. More particularly, the specific voltage range is determined according to a second voltage level controlled by a second bias circuit.

The crystal oscillator and the phase noise reduction method of the present invention can reduce phase noise without calibrating the timing of performing the phase noise reset operation, and overall costs of implementing the phase noise reduction can be greatly reduced in comparison with the related art. Thus, the present invention can reduce phase noise of the crystal oscillator (more particularly, to reduce phase noise of a reference clock such as a pulse wave output from the crystal oscillator) without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
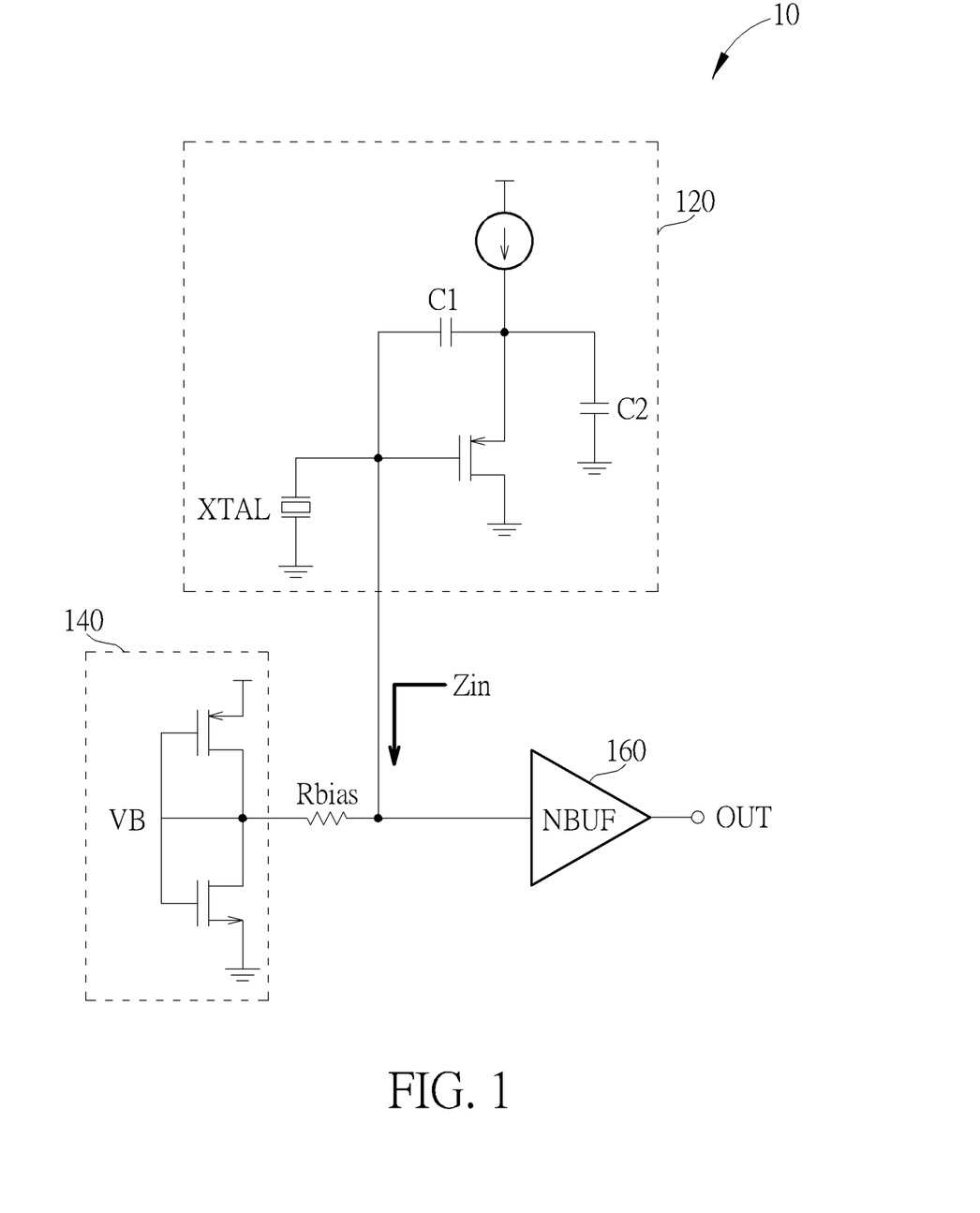
FIG. 1 is a diagram illustrating a crystal oscillator according to an embodiment of the present invention.

FIG. 1 is a diagram illustrating a crystal oscillator 10 according to an embodiment of the present invention. The crystal oscillator 10 may comprise a crystal oscillator core circuit 120, a bias circuit such as a direct current (DC) bias circuit 140, a bias resistor Rbias and a pulse wave buffer such as a square wave buffer 160 (which is labeled "NBUF" for brevity). The crystal oscillator core circuit 120 may be a Colpitts oscillator as shown in FIG. 1, which comprises a crystal tank XTAL (which may be referred to as "crystal oscillator (XO)"), capacitors C1 and C2, a transistor and a current source, but the present invention is not limited thereto. For example, the crystal oscillator core circuit 120 may be replaced with a Pierce oscillator in some embodiments. In this embodiment, the DC bias circuit 140 is coupled to an output terminal of the crystal oscillator 120 through the bias resistor Rbias, and the square wave buffer 160 is coupled to the output terminal of the crystal oscillator 120. For example, the output terminal of the crystal oscillator and an input terminal of the square wave buffer 160 are coupled to a node of the crystal oscillator 10, and the DC bias circuit 140 is coupled to this node through the bias resistor Rbias, where an input impedance of this node may be indicated by Zin, and Zin is roughly determined by the bias resistor Rbias.

In this embodiment, the crystal oscillator core circuit 120 is designed to have a high quality factor (e.g. greater than or equal to 100000), and is configured to generate a sinusoidal wave. The DC bias circuit 140 may comprise one or more transistors as shown in FIG. 1, and is configured to provide a bias voltage of the sinusoidal wave, such as a DC bias voltage VB. For example, the sinusoidal wave is carried on the level of the DC bias voltage VB (more particularly, the sinusoidal wave may regularly vary up and down based on the level of the DC bias voltage VB). In addition, the pulse wave buffer such as the square wave buffer 160 may generate a pulse wave such as a square wave on an output terminal OUT of the square wave buffer 160 according to the sinusoidal wave. For example, the square wave buffer 160 may comprise an inverter or a chain of inverters, wherein when the level of the sinusoidal wave is greater than a threshold (e.g. an input voltage level threshold) of the square wave buffer 160, the square wave may have a first state (e.g. a first logic value such as "1"), and when the level of the sinusoidal wave is less than the threshold of the square wave buffer 160, the square wave may have a second state (e.g. a second logic value such as "0"). In some embodiment, the pulse wave generated by the pulse wave buffer may be a rectangular wave having a duty cycle equal to 50%, such as the square wave. In some embodiments, the pulse wave generated by the pulse wave buffer may be a rectangular wave having a duty cycle that is not 50%. The following descriptions takes the square wave as an example for illustrative purposes only, and is not meant to be a limitation of the present invention.

In one embodiment, the bias resistor Rbias may contribute a majority of phase noise of the square wave. In particular, the bias resistor Rbias may contribute noise which has a positive correlation with the resistance of the bias resistor Rbias. For example, the higher the resistance of the bias resistor Rbias, the higher the noise is generated. In contrast, signal power of the sinusoidal wave has a negative correlation with the resistance of the bias resistor Rbias. For example, the higher the resistance of the bias resistor Rbias, the higher the signal power of the sinusoidal wave (i.e. the lower the resistance of the bias resistor Rbias, the more the loss of the sinusoidal wave is caused). Thus, there is a trade-off between loss and noise, and the present invention aims at breaking this trade-off.

In detail, as the quality factor of the crystal oscillator core circuit 120 is high enough, the thermal noise from the bias resistor Rbias will not greatly impact a signal-to-noise ratio (SNR) of the sinusoidal wave on the output terminal of the crystal oscillator core circuit 120. For example, the crystal oscillator core circuit 120 can filter out most of the noise caused by the bias resistor Rbias at a certain frequency offset such as 100 kilo Hertz (kHz) relative to the oscillation frequency of the sinusoidal wave. Based on the description above, even though the bias resistor Rbias contributes noise, the phase noise of the sinusoidal wave can be small, such as −185 decibels relative to the carrier in one Hertz bandwidth (dBc/Hz). The phase noise on the output terminal OUT of the square wave buffer may be high (e.g. −165 dBc/Hz), however.

Figure 2:
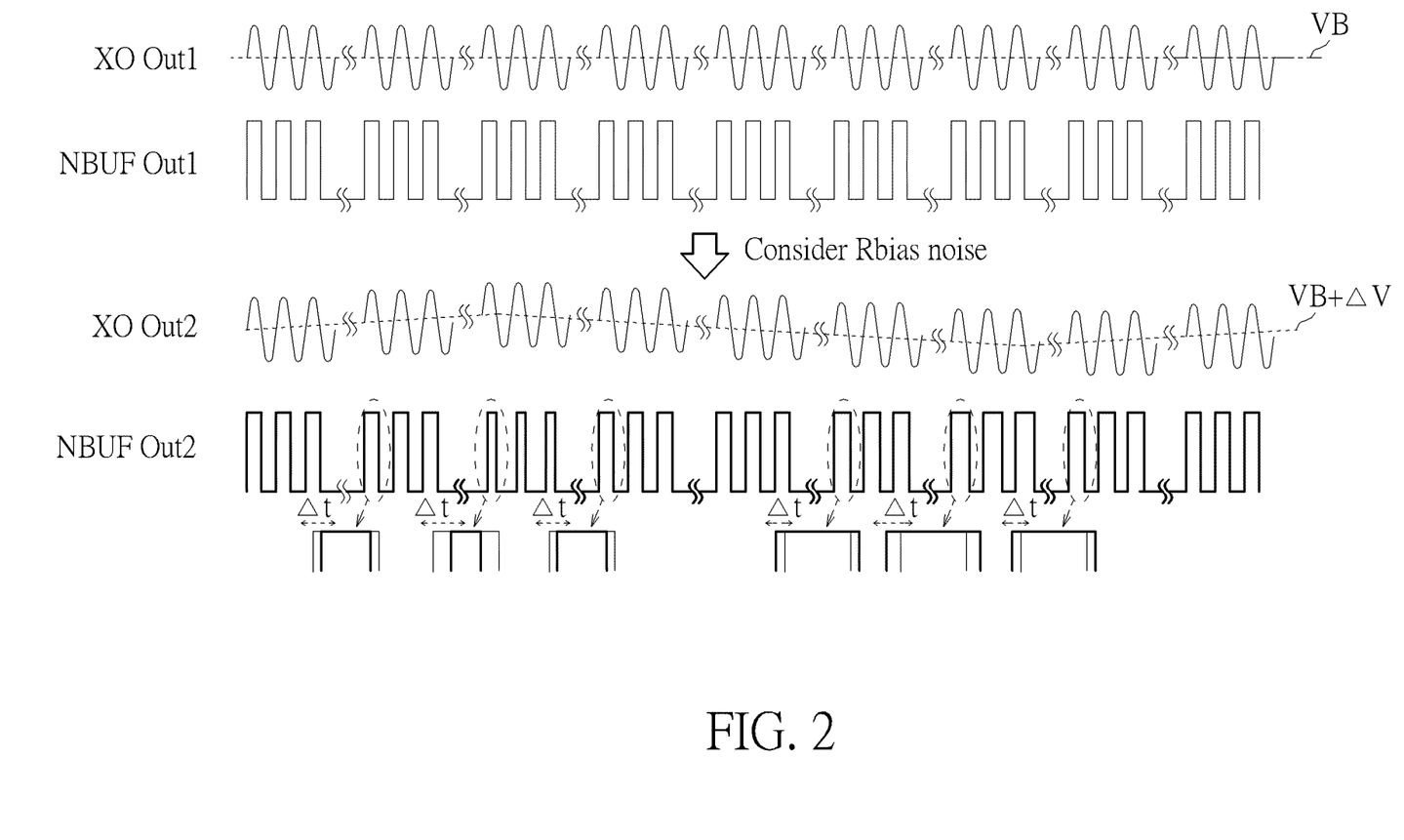
FIG. 2 is a diagram illustrating how noise of a bias resistor is introduced into a square wave output from a square wave buffer.

In order to better understand how the noise of the bias resistor Rbias is introduced into the square wave on the output terminal OUT of the square wave buffer 160, please refer to FIG. 2. If the bias resistor Rbias does not contributes noise, the sinusoidal wave may be carried on a constant level of VB as illustrated by the waveform labeled "XO Out1" (e.g. a 40 Mega Hertz (MHz) sinusoidal wave may regularly vary up and down based on the constant level of VB), and the pulse width of the square wave may be constant, as illustrated by the waveform labeled "NBUF Out1". By comparison, if the bias resistor Rbias contributes noise (e.g. which may be modeled as a 100 kHz bias noise source), the sinusoidal wave may be carried on a varying level VB+ΔV as illustrated by the waveform labeled "XO Out2" (e.g. a 40 MHz sinusoidal wave may vary up and down based on a time-varying level of a 100 kHz bias noise). Thanks to the characteristics brought from the high quality factor of the crystal oscillator core circuit 120, phase noise of the sinusoidal wave is not significantly increased when the noise of the bias resistor Rbias is considered. For the square wave, the timing of state transition (e.g. rising edges and falling edges) may be significantly impacted by voltage level variation on the input terminal of the square wave buffer, and the pulse width of the square wave may be time-varying as illustrated by the portions being circled (e.g. time-varying phase shift Δt) on the waveform labeled "NBUF Out2", which results the phase noise of the square wave on the output terminal OUT of the square wave buffer 160. As shown in the bottommost of FIG. 2, the waveform depicted by thin lines represent the output of the square wave buffer 160 without considering the noise of the bias resistor (which has a constant pulse width), and the waveform depicted by bold lines represent the output of the square wave buffer 160 with considering the noise of the bias resistor (which has a time-varying pulse width), where difference between these two waveform may be illustrated by the time-varying phase shift Δt, which may be regarded as the phase noise mentioned above.

Figure 3:
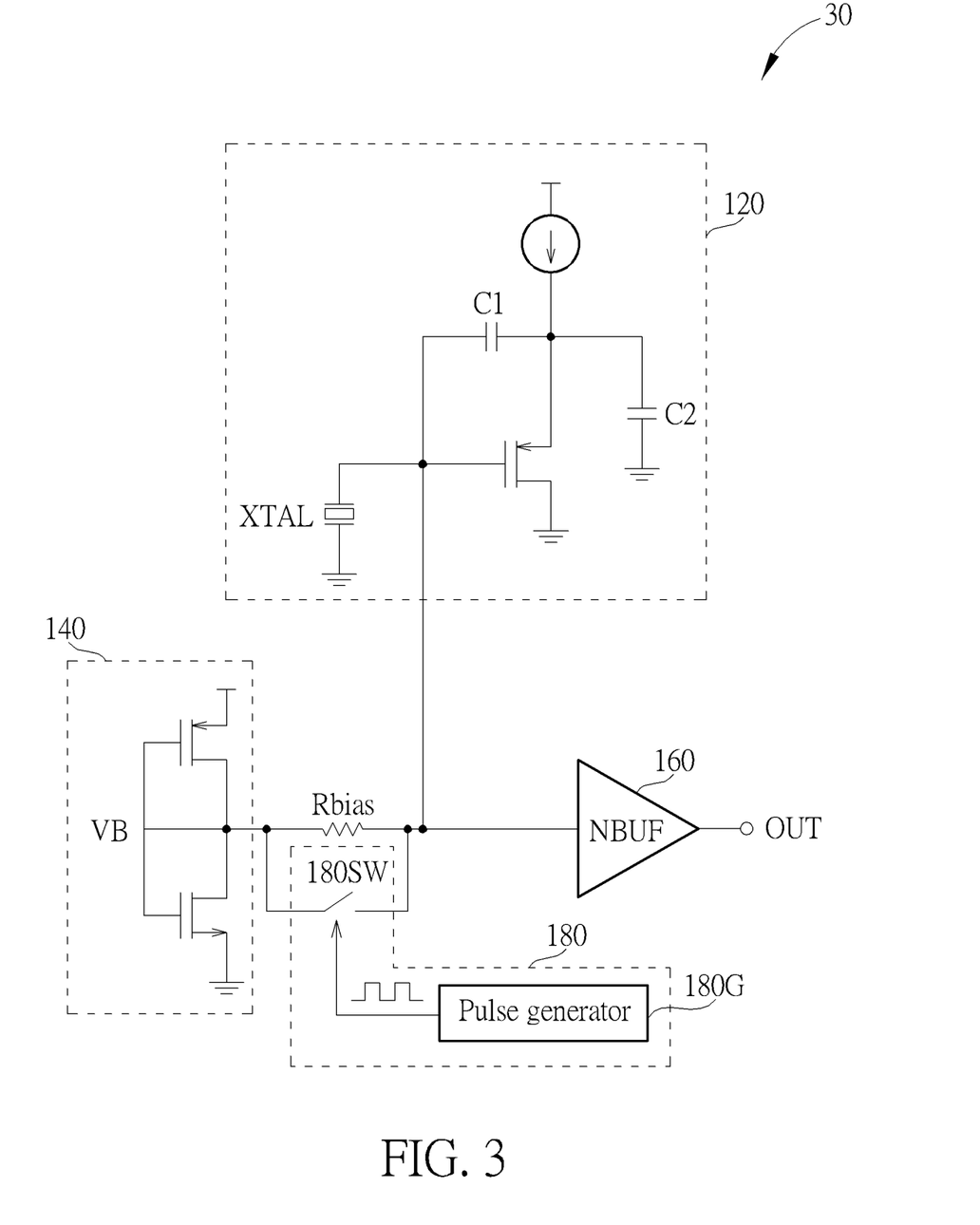
FIG. 3 is a diagram illustrating a crystal oscillator according to an embodiment of the present invention.

FIG. 3 is a diagram illustrating a crystal oscillator 30 according to an embodiment of the present invention. In addition to the crystal oscillator core circuit 120, the DC bias circuit 140, the bias resistor Rbias and the square wave buffer 160, the crystal oscillator 30 may further comprise a phase noise reduction circuit 180. The phase noise reduction circuit 180 is coupled to the output terminal of the crystal oscillator core circuit 120, and may be configured to generate a reset signal comprising at least one reset pulse (e.g. one or more pulses, which may be collectively referred to as the reset pulse) for resetting the bias voltage (e.g. resetting resistor noise on the bias voltage, such as the noise contributed by the bias resistor Rbias) of the sinusoidal wave (e.g. by providing an alternating current (AC) ground path for the resistor noise on the bias voltage). More particularly, the reset signal is generated without calibrating the at least one reset pulse to a zero-crossing point of the sinusoidal wave, where the zero-crossing point of the sinusoidal wave may represents the time point at which the sinusoidal wave varies across the level of the DC bias voltage VB. By simulation, it can be noted that the position of the reset pulse (e.g. the timing of the reset pulse relative to the phase of the sinusoidal wave) will not greatly impact the improvement of the phase noise reduction (i.e. the position of the reset pulse is not critical, and different positions of the reset pulse can obtain similar improvement), so the reset pulse can be at the zero-crossing point or peaking of the sinusoidal wave output, and complicated calibration circuits regarding the timing of the reset pulse are not required.

As shown in FIG. 3, the phase noise reduction circuit 180 may comprise a reset switch 180SW coupled to the output terminal of the crystal oscillator core circuit 120, and may be controlled by the reset signal. In addition, the phase noise reduction circuit 180 may further comprise a pulse generator 180G configured to generate the reset signal. In this embodiment, the reset switch may be turned on in response to the reset pulse, to provide an AC ground path for the resistor noise on the bias voltage to remove the noise on the bias voltage, and thereby reset the bias voltage of the sinusoidal wave to a reset level. For example, the reset switch 180SW may be coupled across the bias resistor Rbias, and when the reset switch is turned on, the noise generated by the bias resistor Rbias may be reset, and the varying bias voltage level of the sinusoidal wave can be pulled back to the original voltage level of the DC bias voltage VB, but the present invention is not limited thereto.

Figure 4:
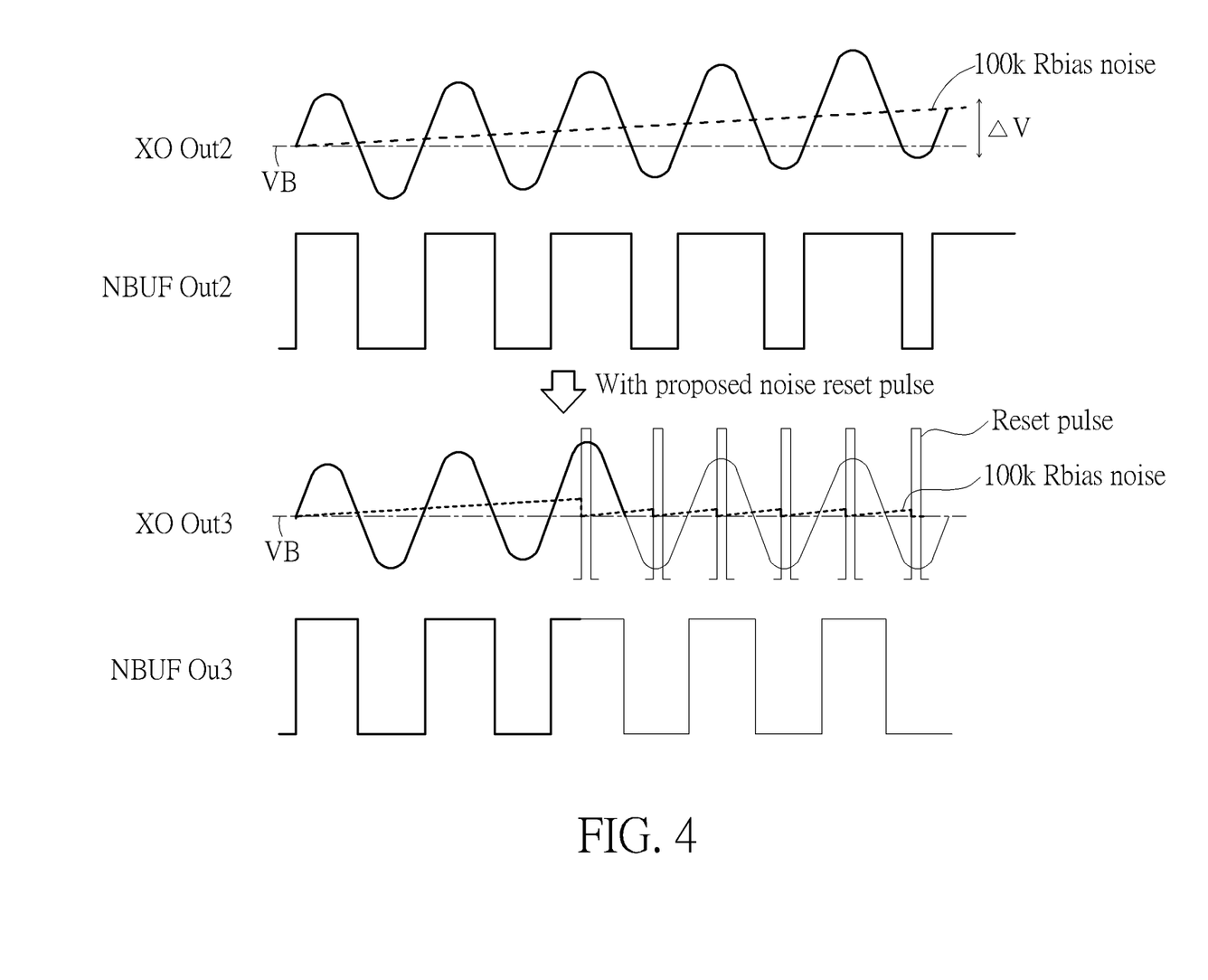
FIG. 4 is a diagram illustrating phase noise reduction with aid of noise reset pulses according to an embodiment of the present invention.

In order to better understand how the phase noise reduction circuit 180 solves the problem of the phase noise caused by the bias resistor Rbias, please refer to FIG. 4. As shown in the upper-half portion of FIG. 4, the waveforms labeled "XO Out2" and "NBUF Out2" represent the sinusoidal wave on the output terminal of the crystal oscillator core circuit 120 and the square wave on the output terminal of the square wave buffer 160 without using the proposed noise reset pulse (e.g. the phase noise reduction circuit 180 is disabled and the reset switch 180SW is always turned off); and as shown in the lower half-portion of FIG. 4, the waveforms labeled "XO Out3" and "NBUF Out3" represent the sinusoidal wave on the output terminal of the crystal oscillator core circuit 120 and the square wave on the output terminal of the square wave buffer 160 with using the proposed noise reset pulse (e.g. the phase noise reduction circuit 180 is enabled and the pulse generator 180G starts to output the reset pulse to periodically turn on the reset switch 180SW). As shown in FIG. 4, the sinusoidal wave may vary up and down based on a time varying level VB+ΔV when the phase noise reduction circuit 180 is disabled, and the pulse width of the square wave is therefore time-varying, which results phase noise. By comparison, when the phase noise reduction circuit 180 is enabled and the pulse generator starts to output the reset pulse to the reset switch 180SW (e.g. periodically output the reset pulse to the reset switch 180SW), the DC bias voltage level of the sinusoidal wave is therefore reset in response to the reset pulse, and the pulse width of the square wave can be substantially constant, or the varying amount of the bias level of the sinusoidal wave can be reduced (e.g. ΔV can be reduced). Thus, the pulse width of the square wave can be constant or substantially constant, and the phase noise is therefore reduced.

It should be noted that both of the resistance of the bias resistor Rbias and an input capacitance on the output terminal of the crystal oscillator core circuit 120 can be designed to be quite large, and a large resistance-capacitance (RC) time constant will make the noise of the bias resistor Rbias have insufficient time for greatly change the level of the sinusoidal wave. For example, after the bias voltage level of the sinusoidal wave is reset and the reset switch 180SW is turned off again, the noise of the bias resistor Rbias will not make the bias voltage level of the sinusoidal wave be greatly changed immediately as the time constant is large enough, and when the noise accumulates and makes the bias voltage level of the sinusoidal wave be slightly changed, the next reset pulse can reset the bias voltage level again, as shown in FIG. 4. In view of this, the frequency of the reset signal is preferably to be fast enough to better suppress the noise of the bias resistor Rbias, and thereby maintain the bias voltage level of the sinusoidal wave. By simulation, assuming the frequency of the sinusoidal wave is 40 MHz, when the frequency of the reset signal is 40 MHz, significant improvements on noise related performance can be observed; and when the frequency of the reset signal is 400 MHz, the noise related performance can be further improved. Thus, a higher frequency of the reset signal is preferred for obtaining a better noise related performance, but the present invention is not limited thereto. In some embodiments, the phase noise reduction circuit 180 may further comprise a frequency multiplier configured to generate a signal having a frequency that is N times the frequency of the square wave output from the square wave buffer 160, and accordingly make the frequency of the reset signal is N times the frequency of the square wave (e.g. there may be N reset pulses within one cycle of the sinusoidal wave or the square wave), where N may be a positive integer greater than or equal to two. In some embodiment, the frequency of the reset signal may be lower than or equal to the frequency of the sinusoidal wave. In some embodiment, the reset pulse may be periodically generated, and the frequency of the reset pulse may be any suitable positive value. In some embodiments, the reset pulse is not periodically generated, e.g. the pulse generator 180G may randomly generate the reset pulse or the occurrence of the reset pulse may be controlled by another controller within the crystal oscillator 30.

In addition to the noise generated by the bias resistor Rbias (which is referred to as the Rbias noise for brevity), there are some factors that may affect the SNR of the sinusoidal wave, such as a turned-on period $T_{ON}$ of the reset pulse (e.g. a pulse width of the reset pulse, which indicates a time length of the reset switch 180SW being turned on), a turned-on resistance $R_{ON}$ of the reset switch 180SW (e.g. a resistance of the reset switch 180SW in a situation where the reset switch 180SW is turned on), and noise corresponding to the turned-on resistance $R_{ON}$ (which is referred to as the $R_{ON}$ noise for brevity). By calculation, the SNR may be expressed as follows:

$$SNR \propto \frac{R_{avg}^2}{N_{Rbias}(f) + N_{Ron}(f)} = \frac{\left[\frac{1}{R_{ON}} * \alpha + \frac{1}{R_{BIAS}} * (1-\alpha)\right]^{-2}}{N_{Rbias}(f) + N_{Ron}(f)}.$$

The symbol f represents a variable of the frequency. The symbol $R_{avg}$ represents an average resistance on the output terminal of the crystal oscillator, which may be further expressed by the turned-on resistance $R_{ON}$, the resistance $R_{BIAS}$ of the bias resistor Rbias, and a parameter α, where $\alpha = T_{ON}/T_{XO}$, and the symbol $T_{XO}$ represents a cycle period of the sinusoidal wave output from the crystal oscillator core circuit 120. The symbols $N_{Rbias}(f)$ and $N_{Ron}(f)$ respectively represent the Rbias noise and the $R_{ON}$ noise corresponding to the frequency f Assuming that the Rbias noise $N_{Rbias}(f)$ can be reset (e.g. considering different combinations of $R_{ON}$ and $T_{ON}$ under a condition where the Rbias noise $N_{Rbias}(f)$ is able to be reset to the same order), the equation shown above may be further arranged as follows:

$$SNR \propto \frac{\left[\frac{R_{ON} R_{BIAS}}{\alpha R_{BIAS} + (1-\alpha) R_{ON}}\right]^2}{N_{Ron}(f)} =$$

$$\frac{\left[\frac{R_{ON} R_{BIAS}}{\alpha R_{BIAS} + (1-\alpha) R_{ON}}\right]^2}{\underbrace{\frac{4\alpha k T R_{ON}}{1 + (2\pi R_{ON} C_{IN} * f)^2}}_{\text{Sample noise}} + \underbrace{(1-\alpha)^2 \frac{kT}{f_{XO} C_{IN}} \text{sinc}^2\left[(1-\alpha)\frac{\pi f}{f_{XO}}\right]}_{\text{Hold noise}}}.$$

The symbol k represents the Boltzmann constant. The symbol T represents the absolute temperature. The symbol $C_{IN}$ represents the input capacitance on the output terminal of the crystal oscillator core circuit 120. The symbol $f_{XO}$ represents the frequency of the sinusoidal wave. As illustrated in the equation shown above, the $R_{ON}$ noise $N_{Ron}(f)$ may comprise the sample noise and the hold noise. Assuming that the frequency f is much smaller than the frequency $f_{XO}$ of the sinusoidal wave (e.g. when $f/f_{XO}$ is quite close to zero), the equation shown above may be further simplified as follows:

$$SNR \propto \frac{\left[\frac{R_{ON} R_{BIAS}}{\alpha R_{BIAS} + (1-\alpha) R_{ON}}\right]^2}{4\alpha k T R_{ON} + (1-\alpha)^2 \frac{kT}{f_{XO} C_{IN}}} =$$

$$\frac{\left[\frac{R_{BIAS}}{R_{BIAS} \frac{\alpha}{R_{ON}} + (1-\alpha)}\right]^2}{4\alpha k T R_{ON} + (1-\alpha)^2 \frac{kT}{f_{XO} C_{IN}}} \begin{cases} \alpha \to 1: \frac{R_{ON}}{4kT} \\ \alpha \to 0: \frac{f_{XO} C_{IN} R_{BIAS}^2}{kT} \end{cases}.$$

Based on the equation shown above, it can be noted that under a condition where the Rbias noise is reset to the same order, it is preferably to design a smaller α for better SNR. For example, under the condition where the Rbias noise is reset to the same order, when the pulse width of the reset pulse is reduced, the SNR of the sinusoidal wave may be increased. Therefore, utilizing a very short reset pulse (e.g. a reset pulse having an extremely narrow pulse width) to reset the Rbias noise is the optimized design for noise related performance of the crystal oscillator 30. In practice, the small α may be implemented by an exclusive-OR (XOR) logic circuit and a very short delay line, and thereby benefit from small area, low current consumption, and low noise from the delay line. The aforementioned very short delay line may comprise one inverter or a chain of inverters, but the present invention is not limited thereto. It should be noted that the delay provided by the aforementioned very short delay line is not limited to a specific value, any delay that is able to reset the bias voltage level of the sinusoidal wave without significantly degrading the SNR, such as 100 picoseconds (ps), 80 ps, etc.

Figure 5:
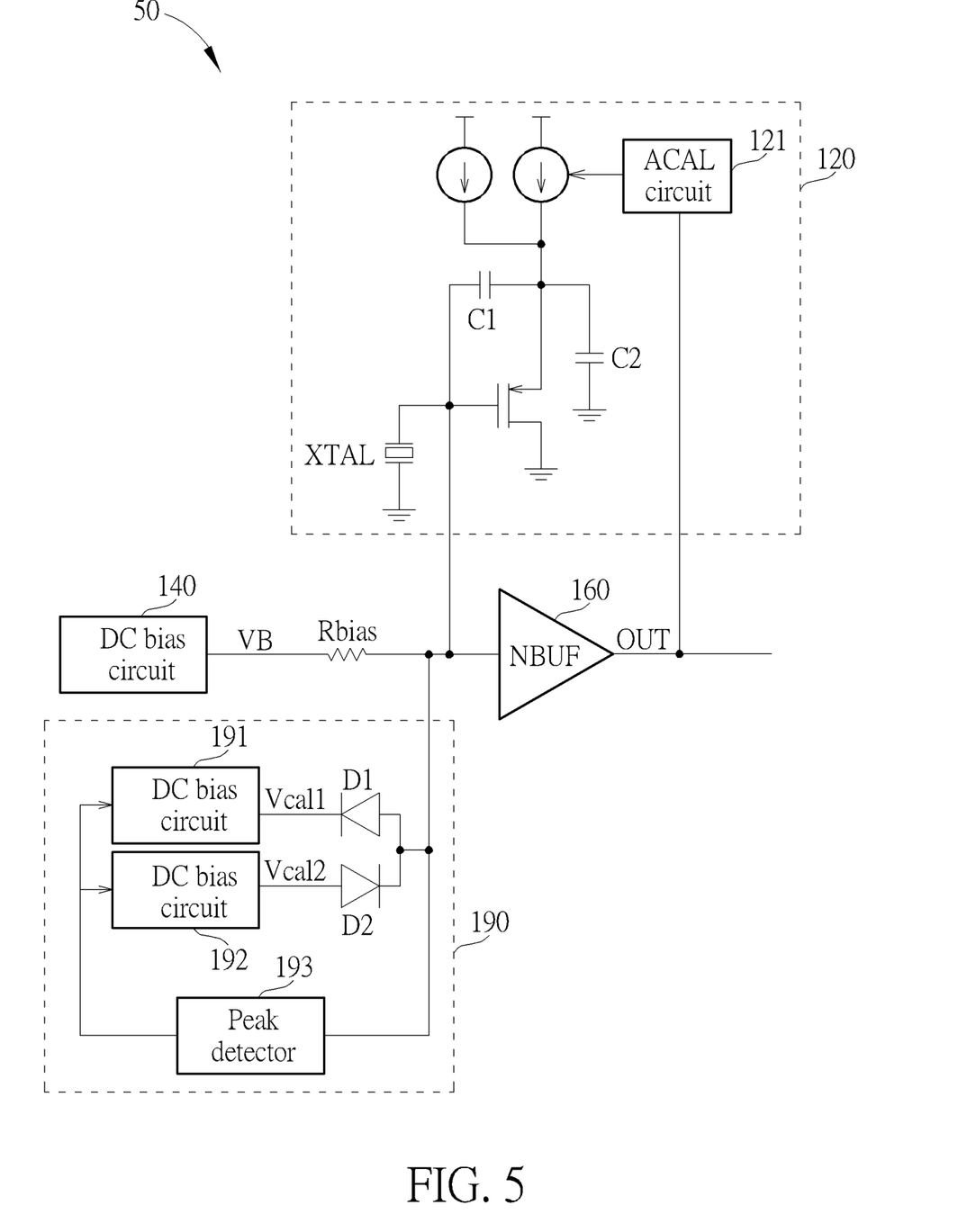
FIG. 5 is a diagram illustrating a crystal oscillator according to an embodiment of the present invention.

FIG. 5 is a diagram illustrating a crystal oscillator 50 according to an embodiment of the present invention, where the crystal oscillator 50 may be a modified version or an example of the crystal oscillator 30 shown in FIG. 3. As shown in FIG. 5, the phase noise reduction circuit 180 may be replaced with a phase noise reduction circuit 190 in this embodiment, where the phase noise reduction circuit 190 is coupled to the output terminal of the crystal oscillator core circuit 120, and may be configured to reset the bias voltage of the sinusoidal wave in response to a voltage level of the sinusoidal wave (e.g. peaking of the sinusoidal wave) exceeding a specific voltage range. In this embodiment, the phase noise reduction circuit 190 may comprise DC bias circuits 191 and 192. The DC bias circuit 191 may be configured to control a DC voltage level Vcal1, and the DC bias circuit 192 may be configured to control a DC voltage level Vcal2, where the specific voltage range is determined according to the DC voltage levels Vcal1 and Vcal2. Furthermore, the phase noise reduction circuit 190 may further comprise a first control switch and a second control switch, where the first control switch is coupled between the output terminal of the crystal oscillator core circuit 120 and the DC bias circuit 191, and the second control switch is coupled between the output terminal of the crystal oscillator core circuit 120 and the DC bias circuit 192. For example, the first control switch may be conductive in response to the voltage level of the sinusoidal wave being greater than an upper bound level, and the second control switch may be conductive in response to the voltage level of the sinusoidal wave being less than a lower bound level, where the upper bound level and the lower bound level may correspond to the DC voltage levels Vcal1 and Vcal2, respectively.

In this embodiment, the first control switch may comprise a first diode such as a diode D1, and the second control switch may comprise a second diode such as a diode D2. As shown in FIG. 5, an anode of the diode D1 may be coupled to the output terminal of the crystal oscillator core circuit 120, and a cathode of the diode D1 may be coupled to the DC bias circuit 191. In addition, an anode of the diode D2 may be coupled to the DC bias circuit 192, and a cathode of the diode D2 may be coupled to the output terminal of the crystal oscillator core circuit 120. In detail, when a voltage difference between the anode and the cathode of the diode D1 is greater than a threshold voltage Vth1 of the diode D1, the diode D1 can be conductive (e.g. the first control switch may be regarded as being turned on); otherwise, the diode D1 cannot be conductive (e.g. the first control switch may be regarded as being turned off). Similarly, when a voltage difference between the anode and the cathode of the diode D2 is greater than a threshold voltage Vth2 of the diode D2, the diode D2 can be conductive (e.g. the second control switch may be regarded as being turned on); otherwise, the diode D2 cannot be conductive (e.g. the second control switch may be regarded as being turned off).

Figure 6:
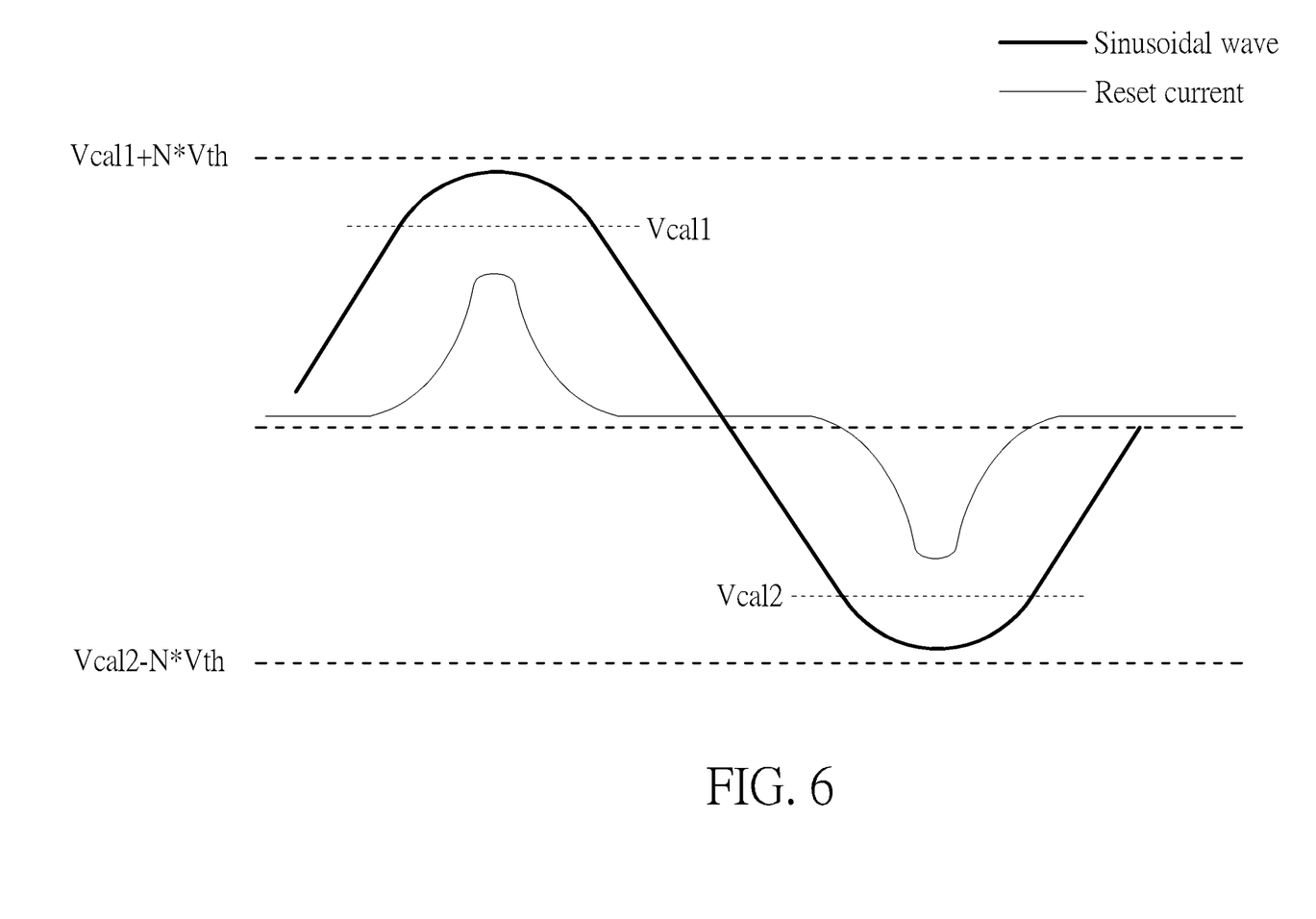
FIG. 6 is a diagram illustrating that a sinusoidal wave is clamped between an upper bound level and a lower bound level.

It should be noted that any (e.g. each) of the diodes D1 and D2 is not limited to be implemented by a single diode. For example, any (e.g. each) of the diodes D1 and D2 may be implemented by a cascode structure of diode units, e.g. N diode units connected in series, to obtain a threshold voltage N*Vth, depending on the essential voltage swing of the sinusoidal wave, where Vth may represent the threshold voltage by one diode units, and N may represent the number of diode units being connected in series. For brevity, assume that Vth1=Vth2=N*Vth, but the present invention is not limited thereto. In this embodiment, when the voltage level of the sinusoidal wave exceed the upper bound level, the diode D1 may be conductive in response to the voltage difference across the diode D1 exceeding the threshold voltage Vth1, and a maximum level of the sinusoidal wave may therefore be clamped to the upper bound level (e.g. Vcal1+N*Vth) as shown in FIG. 6; and when the voltage level of the sinusoidal wave exceed the lower bound level, the diode D2 may be conductive in response to the voltage difference across the diode D1 exceeding the threshold voltage Vth2, and a minimum level of the sinusoidal wave may therefore be clamped to the lower bound level (e.g. Vcal2−N*Vth) as shown in FIG. 6. Based on the basic characteristics of diodes, the diode D1 and/or D2 can be automatically turned on by the voltage swing of the sinusoidal wave, and noise reset regarding the DC bias voltage level of the sinusoidal wave can take effect at the maximum level (e.g. wave peaks) and/or the minimum level (e.g. wave troughs) of the sinusoidal wave as illustrated by a reset current (e.g. a current flowing through the node coupled to the output terminal of the crystal oscillator core circuit 120) shown in FIG. 6.

In order to guarantee that the DC voltage levels Vcal1 and Vcal2 is set to appropriate levels that are capable of turning on the diodes D1 and/or D2, a calibration flow may be performed to calibrate the DC voltage levels Vcal1 and Vcal2. In the calibration flow, the DC voltage levels Vcal1 and Vcal2 may be respectively set to an initial maximum level and an initial minimum level at the beginning (e.g. at the beginning of the calibration flow or in an initial phase of the crystal oscillator), where the initial maximum level may be the highest voltage level that the DC bias circuit 191 is able to provide, and the initial minimum level may be the lowest voltage level that the DC bias circuit 192 is able to provide. The DC voltage level Vcal1 may be stepwise decreased, starting from the initial maximum level, to make a maximum level (e.g. the wave peaks) of the sinusoidal wave be able to turn on the first control switch such as the diode D1. The DC voltage level Vcal2 may be stepwise increased, starting from the initial minimum level, to make a minimum level (e.g. the wave troughs) of the sinusoidal wave be able to turn on the second control switch such as the diode D2.

For example, the DC bias circuit 191 may control the DC voltage level Vcal1 according to a first calibration code such as a three-bit code, where different values (e.g. candidate values such as 111, 110, . . . , and 000) of the first calibration code may respectively correspond to different values (e.g. candidate values such as Vcal1(7), Vcal1(6), . . . , and Vcal1(0), where Vcal1(7)>Vcal1(6)> . . . >Vcal1(0)) of the DC voltage level Vcal1. When the first calibration code is 111, the DC bias circuit 191 may control the DC voltage level Vcal1 to be a highest voltage level (e.g. 0.9V) within a tuning range of the DC voltage level Vcal1, and when the first calibration code is 000, the DC bias circuit 191 may control the DC voltage level Vcal1 to be a lowest voltage level (e.g. 0V) within the tuning range of the DC voltage level Vcal1, where the rest values of the first calibration code may be deduced by analogy, e.g. {Vcal1(7), Vcal1(6), Vcal1(5), Vcal1(4), Vcal1(3), Vcal1(2), Vcal1(1), Vcal1(0)} may be {0.9V, 0.79V, 0.68V, 0.45V, 0.34V, 0.22V, 0.11V, 0V}. The first calibration code may be set to 111 at the beginning, and the DC voltage level Vcal1 corresponding to this value of the first calibration code is not able to make the condition of turning on the diode D1 occur. The first calibration code is therefore stepwise switched to 110, 101, 100, etc., to find at least one value of the first calibration code, which is able to make the condition of turning on the diode D1 occur. Similarly, the DC bias circuit 192 may control the DC voltage level Vcal2 according to a second calibration code such as a three-bit code, where different values (e.g. candidate values such as 111, 110, . . . , and 000) of the second calibration code may respectively correspond to different values (e.g. candidate values such as Vcal2(7), Vcal2(6), . . . , and Vcal2(0), where Vcal2(7)< Vcal2(6)< . . . <Vcal2(0)) of the DC voltage level Vcal2. When the second calibration code is 111, the DC bias circuit 192 may control the DC voltage level Vcal2 to be a lowest voltage level (e.g. 0V) within a tuning range of the DC voltage level Vcal2, and when the second calibration code is 000, the DC bias circuit 192 may control the DC voltage level Vcal2 to be a highest voltage level (e.g. 0.9V) within the tuning range of the DC voltage level Vcal2, where the rest values of the second calibration code may be deduced by analogy, e.g. {Vcal2(7), Vcal2(6), Vcal2(5), Vcal2(4), Vcal2(3), Vcal2(2), Vcal2(1), Vcal2(0)} may be {0V, 0.11V, 0.22V, 0.34V, 0.45V, 0.68V, 0.79V, 0.9V}. The second calibration code may be set to 111 at the beginning, and the DC voltage level Vcal2 corresponding to this value of the second calibration code is not able to make the condition of turning on the diode D2 occur. The second calibration code is therefore stepwise switched to 110, 101, 100, etc., to find at least one value of the second calibration code, which is able to make the condition of turning on the diode D2 occur.

In one embodiment, the phase noise reduction circuit 190 may further comprise a peak detector 193 coupled to the output terminal of the crystal oscillator core circuit 120, where the peak detector 193 may be configured to detect a swing of the sinusoidal wave to generate a detection result (e.g. detecting a peak value of the sinusoidal wave to obtain information related to the swing), and the DC bias circuits 191 and 192 may respectively control the DC voltage levels Vcal1 and Vcal2 according to the detection result. For example, the peak detector 193 may output a DC voltage according to the swing (or the peak value) of the sinusoidal wave, where this DC voltage may be configured to determine whether the swing of the sinusoidal wave is changed (e.g. reduced), but the present invention is not limited thereto. Assume that when the swing of the sinusoidal wave is ±1000 mV, the DC voltage output from the peak detector 193 may be 500 mV, and when the swing of the sinusoidal wave is ±900 mV, the DC voltage output from the peak detector 193 may be 450 mV. It should be noted that those skilled in this art should understand detailed implementation of the peak detector 193 based on the descriptions mentioned above, and related details are omitted here for brevity.

In addition, the current source within the crystal oscillator core circuit 120 may comprise one or more current units connected in parallel, and the one or more current units may be configured to provide a bias current of the crystal oscillator core circuit 120 to control the swing of the sinusoidal wave. For example, the bias current may depend on the number of current units being enabled in the current source, and the swing of the sinusoidal wave depends on the bias current. In one embodiment, the crystal oscillator core circuit 120 may further comprise a current calibration (ACAL) circuit 121 coupled to the one or more current units, and the number of current units being enabled in the current source depends on a calibration code output from the ACAL circuit 121. Thus, the ACAL circuit 121 can control the swing of the sinusoidal wave by controlling the calibration code. In this embodiment, the ACAL circuit 121 may calibrate the current source by a speed/frequency of the square wave on the output terminal OUT (e.g. modifying the calibration code one time in each cycle of the square wave during the calibration regarding the current source), but the present invention is not limited thereto.

In detail, at the beginning of the calibration regarding the DC voltage levels Vcal1 and Vcal2, the DC voltage level Vcal1 is set to the initial maximum level and the DC voltage level Vcal2 is set to the initial minimum level. Before any (e.g. each) of the DC voltage levels Vcal1 and Vcal2 is stepwise modified as mentioned above, the ACAL circuit 121 may calibrate the bias current, to make the swing of the sinusoidal wave fall into a range between a tunable maximum level (e.g. an initial level of Vcal1+N*Vth) related to the initial maximum level and a tunable minimum level (e.g. an initial level of Vcal2−N*Vth) related to the initial minimum level. Thus, the calibration regarding the DC voltage levels Vcal1 and Vcal2 is guaranteed to be started from a condition where the first control switch and the second control switch (e.g. the diode D1 and D2) are unable to be conductive in response to the maximum level and the minimum level of the sinusoidal wave. Then, any (e.g. each) of the DC voltage levels Vcal1 and Vcal2 may be stepwise modified according to the detection result (e.g. the DC voltage output from the peak detector 193), to make the first control switch such as the diode D1 be able to be conductive in response to the maximum level (e.g. the wave peaks) of the sinusoidal wave, and/or to make the second control switch such as the diode D2 be able to be conductive in response to the minimum level (e.g. the wave troughs) of the sinusoidal wave. For example, assume that the DC voltage output from the peak detector 193 is 500 mV at the beginning of the calibration regarding the DC voltage levels Vcal1 and Vcal2. After the DC voltage level Vcal1 is decreased by one step (e.g. switching the first calibration code from 111 to 110) and/or the DC voltage level Vcal2 is increased by one step (e.g. switching the second calibration code from 111 to 110), if the DC voltage output from the peak detector 193 is still 500 mV, the DC voltage level Vcal1 may be further decreased by another step (e.g. switching the first calibration code from 110 to 101) and/or the DC voltage level Vcal2 may be further increased by another step (e.g. switching the second calibration code from 110 to 101); and if the DC voltage output from the peak detector 193 becomes 480 mV, which means the swing of the sinusoidal wave is reduced because the noise reset regarding the DC bias voltage level of the sinusoidal wave takes effect, the current values (e.g. the latest values) of the first calibration code and the second calibration code may be the final values of the first calibration code and the second calibration code, respectively, and the calibration regarding the DC voltage levels Vcal1 and Vcal2 is therefore completed.

Note that the tuning ranges of the values of voltage levels and calibration codes mentioned above are for illustrative purposes only, and are not meant to be a limitation of the present invention. For example, the number of bits of the first calibration code and the second calibration code may vary. For example, the turning range of the DC voltage level Vcal1 may be the same as the tuning range of the DC voltage level Vcal2. In another example, the tuning range of the DC voltage level Vcal1 may be different from the tuning range of the DC voltage level Vcal2. In addition, the calibration of the DC voltage level Vcal1 and the calibration of the DC voltage level Vcal2 do not have to be performed concurrently. For example, the calibration of the DC voltage level Vcal2 may be performed after the calibration of the DC voltage level Vcal1 is completed. In another example, the calibration of the DC voltage level Vcal1 may be performed after the calibration of the DC voltage level Vcal2 is completed. Furthermore, some embodiments may perform calibration on one of the DC voltage levels Vcal1 and Vcal2 only. In practice, it is preferably to calibrate both of the DC voltage levels Vcal1 and Vcal2 for obtaining a symmetric waveform of the sinusoidal wave. For example, the DC voltage levels Vcal1 and Vcal2 may be calibrated concurrently with aid of the same calibration code (e.g. the first calibration code may be equal to the second calibration code), but the present invention is not limited thereto.

Figure 7:
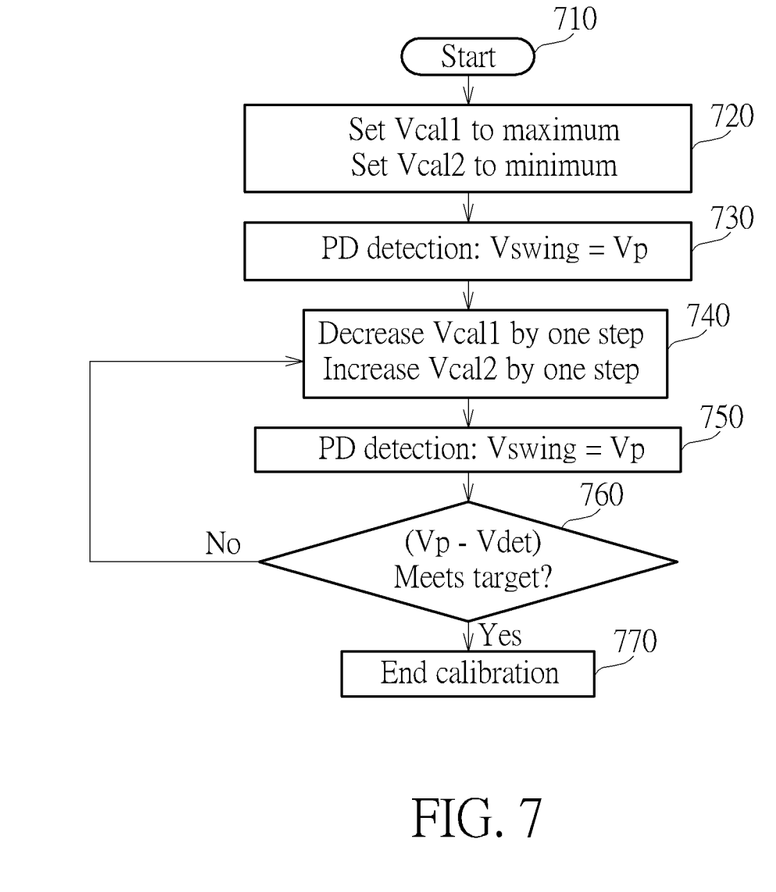
FIG. 7 illustrates a working flow of calibration regarding some voltages shown in FIG. 5 according to an embodiment of the present invention.

For better comprehension, please refer to FIG. 7, which illustrates a working flow of the calibration regarding the DC voltage levels Vcal1 and Vcal2 shown in FIG. 5 according to an embodiment of the present invention. For example, a calibration control circuit within the phase noise reduction circuit 190 may utilize multiple control signals for controlling the working flow of the calibration, but the present invention is not limited thereto. It should be noted that the working flow shown in FIG. 7 is for illustrative purposes only, and is not meant to be a limitation of the present invention. In some embodiments, one or more steps may be added, deleted or modified in the working flow shown in FIG. 7. In addition, if a same result may be obtained, these steps do not have to be executed in the exact order shown in FIG. 7.

In Step 710, when the crystal oscillator 50 is enabled, the working flow of the calibration starts.

In Step 720, the calibration control circuit may control the DC bias circuit 191 to set the DC voltage level Vcal1 to maximum (e.g. the initial maximum level) and control the DC bias circuit 192 to set the DC voltage level Vcal2 to minimum (e.g. the initial minimum level).

In Step 730, the calibration control circuit may control the peak detector 193 to detect the swing of the sinusoidal wave (which may be referred to as "PD detection"). Assume that the detected swing Vswing of the sinusoidal wave in this step is Vp (e.g. Vswing=Vp).

In Step 740, the calibration control circuit may control the DC bias circuit 191 to decrease the DC voltage level Vcal1 by one step, and control the DC bias circuit 192 to increase the DC voltage level Vcal2 by one step.

In Step 750, the calibration control circuit may control the peak detector 193 to detect the swing of the sinusoidal wave again. Assume that the detected swing Vswing of the sinusoidal wave in this step is Vdet (e.g. Vswing=Vdet).

In Step 760, the calibration control circuit may determine whether (Vp−Vdet) meets a target (e.g. whether (Vp−Vdet) is greater than a predetermine voltage difference). If the determination result is "Yes", the working flow proceeds with Step 780; and if the determination result is "No", the working flow proceeds with Step 740.

In Step 770, the calibration control circuit ends the calibration.

It should be noted that any (e.g. each) of the diodes D1 and D2 does not have to be implemented by typical diodes. For example, any device comprising at least one P-N junction may be modified to implement the diodes D1 and D2. In some embodiments, the diodes D1 may be implemented by a P-type transistor, where a drain and a gate of the P-type transistor may be coupled to each other, to configure this P-type transistor as a diode-connected transistor, which has similar characteristics as typical diodes. In some embodiments, the diodes D2 may be implemented by an N-type transistor, where a drain and a gate of the N-type transistor may be coupled to each other, to configure this N-type transistor as a diode-connected transistor, which has similar characteristics as typical diodes. Those skilled in this art should understand how to adopt diode-connected transistors in the architecture shown in FIG. 5 according to the above descriptions, and related details are omitted here for brevity.

Figure 8:
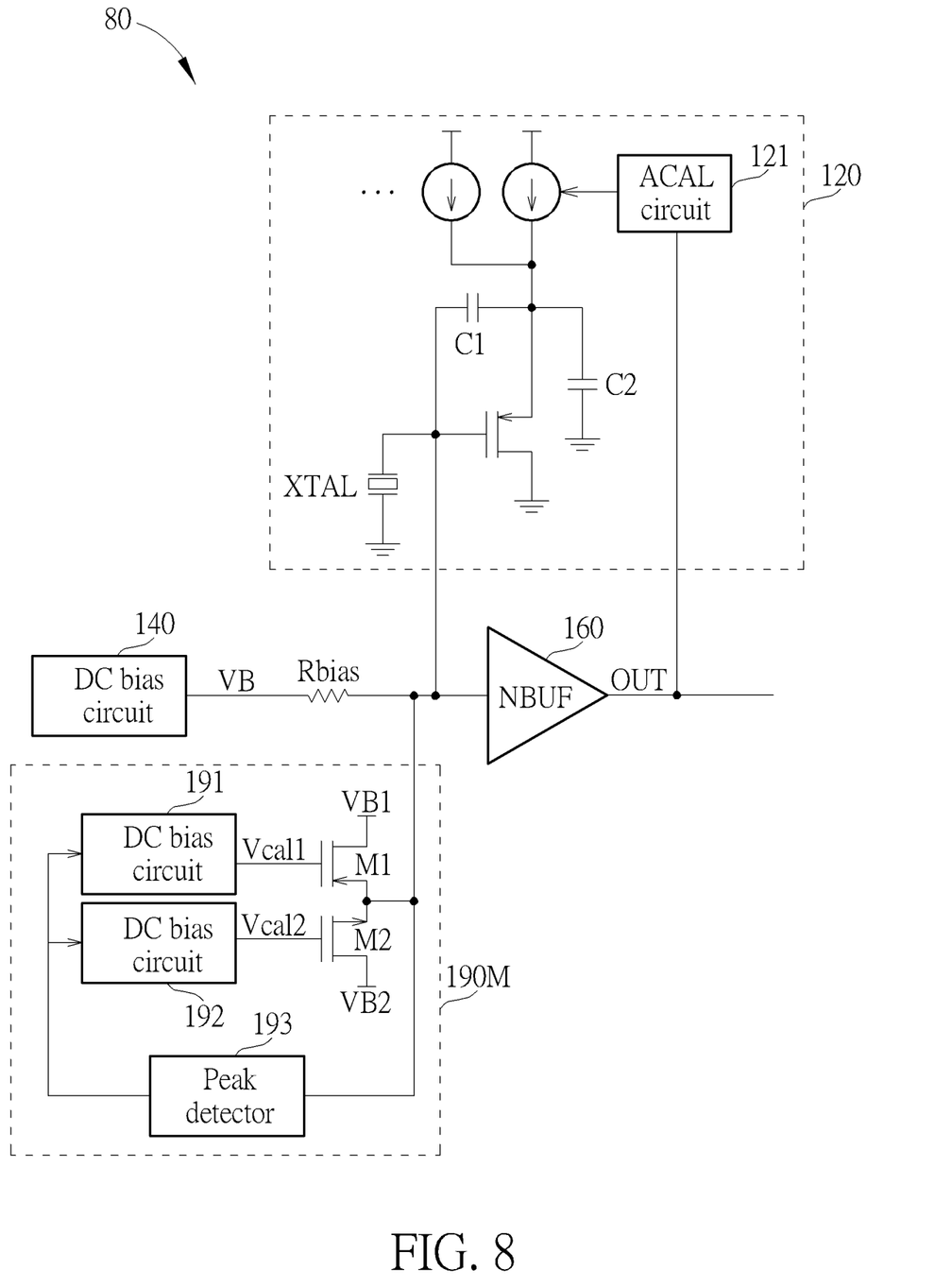
FIG. 8 is a diagram illustrating a crystal oscillator according to an embodiment of the present invention.

FIG. 8 is a diagram illustrating a crystal oscillator 80 according to an embodiment of the present invention, where the crystal oscillator 80 may be a modified version or an example of the crystal oscillator 50 shown in FIG. 5. For example, the phase noise reduction circuit 190 may be replaced with a phase noise reduction circuit 190M as shown in FIG. 8, and more particularly, the diodes D1 and D2 are replaced with a P-type transistor M1 and an N-type transistor M2, respectively. As shown in FIG. 8, a gate terminal of the P-type transistor M1 is coupled to the DC bias circuit 191 for receiving the DC voltage level Vcal1, a drain terminal of the P-type transistor M1 is configured to receive a DC voltage level VB1, and a source terminal of the P-type transistor M1 is coupled to the output terminal of the crystal oscillator core circuit 120. In addition, a gate terminal of the N-type transistor M2 is coupled to the DC bias circuit 192 for receiving the DC voltage level Vcal2, a drain terminal of the N-type transistor M2 is configured to receive a DC voltage level VB2, and a source terminal of the N-type transistor M2 is coupled to the output terminal of the crystal oscillator core circuit 120. Based on this architecture, when the voltage level of the sinusoidal wave (e.g. the maximum level such as the wave peaks of the sinusoidal wave) exceeds the upper bound level and thereby makes a difference between the voltage level of the sinusoidal wave and the DC voltage level Vcal1 be greater than a threshold voltage (e.g. making Vsin−Vcal1>|Vthp|, where Vsin represents an instant level of the sinusoidal wave, Vthp represents a threshold voltage of the P-type transistor M1, and |Vthp| represents an absolute value of Vthp), the P-type transistor M1 may be turned on and the DC bias voltage level of the sinusoidal wave may be reset to VB1. When the voltage level of the sinusoidal wave (e.g. the minimum level such as the wave troughs of the sinusoidal wave) exceeds the lower bound level and thereby makes a difference between the DC voltage level Vcal2 and the voltage level of the sinusoidal wave be greater than a threshold voltage (e.g. making Vcal2−Vsin>|Vthn|, where Vthn represents a threshold voltage of the N-type transistor M2, and |Vthn| represents an absolute value of Vthn), the N-type transistor M2 may be turned on and the DC bias voltage level of the sinusoidal wave may be reset to VB2.

In some embodiments, the DC voltage levels VB1 and VB2 may be the same. In some embodiments, the DC voltage levels VB1 and VB2 may be different. In some embodiments, both of the DC voltage levels VB1 and VB2 may be the same as the DC voltage level of the DC bias voltage VB provided by the DC bias circuit 140. In some embodiments, at least one of DC voltage levels VB1 and VB2 (e.g. one of them or both of them) may be different from the DC voltage level of the DC bias voltage VB provided by the DC bias circuit 140. As long as the DC voltage levels VB1 and VB2 are clean and constant voltage levels (e.g. each of the DC voltage levels VB1 and VB2 has extremely low noise), the DC voltage levels VB1 and VB2 are not limited to specific voltage levels. In addition, the working flow of the calibration regarding the DC voltage levels Vcal1 and Vcal2 shown in FIG. 5 can also be adopted in the crystal oscillator 80 shown in FIG. 8. For brevity, similar descriptions related to the calibration regarding the DC voltage levels Vcal1 and Vcal2 are not repeated here.

Figure 9:
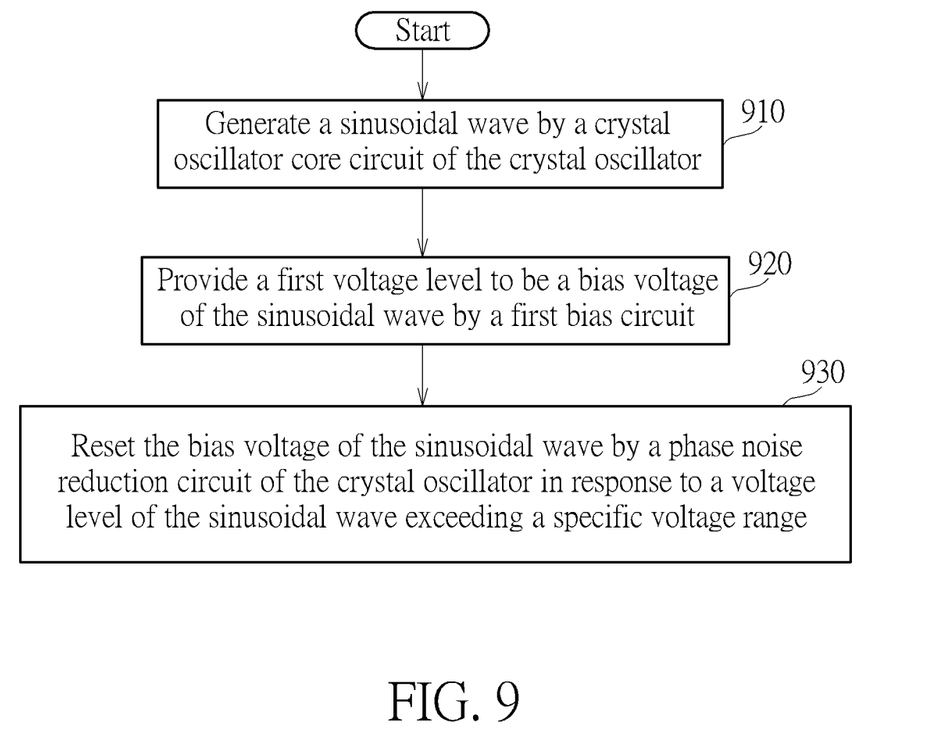
FIG. 9 illustrates a working flow of a phase noise reduction method of a crystal oscillator according to an embodiment of the present invention.

To summarize, please refer to FIG. 9, which illustrates a working flow of a phase noise reduction method of a crystal oscillator (e.g. the crystal oscillator 50 or the crystal oscillator 80) according to an embodiment of the present invention. It should be noted that the working flow shown in FIG. 9 is for illustrative purposes only, and is not meant to be a limitation of the present invention. In some embodiments, one or more steps may be added, deleted or modified in the working flow shown in FIG. 9. In addition, if a same result may be obtained, these steps do not have to be executed in the exact order shown in FIG. 9.

In Step 910, the crystal oscillator may generate a sinusoidal wave by a crystal oscillator core circuit (e.g. the crystal oscillator core circuit 120) of the crystal oscillator.

In Step 920, the crystal oscillator may provide a first voltage level (e.g. the level of the DC bias voltage VB) to be a bias voltage of the sinusoidal wave by a first bias circuit (e.g. the DC bias circuit 140) of the crystal oscillator.

In Step 930, the crystal oscillator reset the bias voltage of the sinusoidal wave by a phase noise reduction circuit (e.g. the phase noise reduction circuit 190 shown in FIG. 5 or the phase noise reduction circuit 190M shown in FIG. 8) of the crystal oscillator in response to a voltage level of the sinusoidal wave exceeding a specific voltage range.

As each of the diode/diode-like components (e.g. the diodes D1/D2 or the transistors M1/M2) utilized in the present invention has the characteristic of being automatically turned on in response to a voltage across terminals of a diode/diode-like component exceeding a threshold of this diode/diode-like component, the noise reset regarding the DC bias voltage level of the sinusoidal wave can take effect at least at the time points of wave peaks or wave troughs of the sinusoidal wave. Thus, the present invention can improve the phase noise related performance without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A crystal oscillator, comprising:
a crystal oscillator core circuit, configured to generate a sinusoidal wave;
a first bias circuit, coupled to an output terminal of the crystal oscillator core circuit, configured to provide a first voltage level to be a direct current (DC) bias voltage of the sinusoidal wave; and
a phase noise reduction circuit, coupled to the output terminal of the crystal oscillator core circuit, configured to reset the DC bias voltage of the sinusoidal wave in response to a voltage level of the sinusoidal wave exceeding a specific voltage range;
wherein the phase noise reduction circuit comprises:
a second bias circuit, configured to control a second voltage level;
wherein the specific voltage range is determined according to the second voltage level.
2. A crystal oscillator, comprising:
a crystal oscillator core circuit, configured to generate a sinusoidal wave;
a first bias circuit, coupled to an output terminal of the crystal oscillator core circuit, configured to provide a first voltage level to be a bias voltage of the sinusoidal wave; and
a phase noise reduction circuit, coupled to the output terminal of the crystal oscillator core circuit, configured to reset the bias voltage of the sinusoidal wave in response to a voltage level of the sinusoidal wave exceeding a specific voltage range;
wherein the phase noise reduction circuit comprises:
a second bias circuit, configured to control a second voltage level, wherein the specific voltage range is determined according to the second voltage level; and a control switch, coupled between the output terminal of the crystal oscillator core circuit and the second bias circuit, configured to be conductive in response to the voltage level of the sinusoidal wave being greater than an upper bound level or being less than a lower bound level;

wherein the upper bound level or the lower bound level corresponds to the second voltage level.

3. The crystal oscillator of claim 2, wherein the second voltage level is stepwise decreased, starting from an initial maximum level, to make a maximum level of the sinusoidal wave be able to turn on the control switch.

4. The crystal oscillator of claim 2, wherein the second voltage level is stepwise increased, starting from an initial minimum level, to make a minimum level of the sinusoidal wave be able to turn on the control switch.

5. The crystal oscillator of claim 2, wherein the phase noise reduction circuit further comprises:

a peak detector, coupled to the output terminal of the crystal oscillator core circuit, configured to detect a swing of the sinusoidal wave to generate a detection result;

wherein the second bias circuit controls the second voltage level according to the detection result.

6. The crystal oscillator of claim 5, wherein:

in an initial phase of the crystal oscillator, the second voltage level is set to an initial maximum level or an initial minimum level; and the second voltage level is stepwise modified according to the detection result, to make the control switch be able to be conductive in response to one of a maximum level or a minimum level of the sinusoidal wave.

7. The crystal oscillator of claim 6, wherein the crystal oscillator core circuit comprises:

one or more current units, configured to provide a bias current of the crystal oscillator core circuit to control the swing of the sinusoidal wave; and a current calibration circuit, coupled to the one or more current units, wherein before the second voltage level is stepwise modified, the current calibration circuit calibrates the bias current, to make the swing of the sinusoidal wave fall into a range between a tunable maximum level related to the initial maximum level and a tunable minimum level related to the initial minimum level.

8. The crystal oscillator of claim 2, wherein the control switch comprises a diode coupled between the output terminal of the crystal oscillator core circuit and the second bias circuit.

9. The crystal oscillator of claim 2, wherein the control switch comprises a P-type transistor, and a source terminal and a gate terminal of the P-type transistor are respectively coupled to the output terminal of the crystal oscillator core circuit and the second bias circuit.

10. The crystal oscillator of claim 2, wherein the control switch comprises an N-type transistor, and a source terminal and a gate terminal of the N-type transistor are respectively coupled to the output terminal of the crystal oscillator core circuit and the second bias circuit.

11. A phase noise reduction method of a crystal oscillator, comprising:

a step of generating a sinusoidal wave by a crystal oscillator core circuit of the crystal oscillator;

a step of providing a first voltage level to be a bias voltage of the sinusoidal wave by a first bias circuit of the crystal oscillator; and a step of resetting the bias voltage of the sinusoidal wave by a phase noise reduction circuit of the crystal oscillator in response to a voltage level of the sinusoidal wave exceeding a specific voltage range;

wherein the specific voltage range is determined according to a second voltage level controlled by a second bias circuit, and the step of resetting the bias voltage of the sinusoidal wave by the phase noise reduction circuit of the crystal oscillator in response to the voltage level of the sinusoidal wave exceeding the specific voltage range comprises:

controlling a control switch coupled between the output terminal of the crystal oscillator core circuit and the second bias circuit to be conductive in response to the voltage level of the sinusoidal wave being greater than an upper bound level or being less than a lower bound level;

wherein the upper bound level or the lower bound level corresponds to the second voltage level.

12. The phase noise reduction method of claim 11, wherein the second voltage level is stepwise decreased, starting from an initial maximum level, to make a maximum level of the sinusoidal wave be able to turn on the control switch.

13. The phase noise reduction method of claim 11, wherein the second voltage level is stepwise increased, starting from an initial minimum level, to make a minimum level of the sinusoidal wave be able to turn on the control switch.

14. The phase noise reduction method of claim 12, wherein the step of resetting the bias voltage of the sinusoidal wave by the phase noise reduction circuit of the crystal oscillator in response to the voltage level of the sinusoidal wave exceeding the specific voltage range further comprises:

a step of detecting a swing of the sinusoidal wave by a peak detector to generate a detection result;

wherein the second bias circuit controls the second voltage level according to the detection result.

15. The phase noise reduction method of claim 14, further comprising:

in an initial phase of the crystal oscillator, a step of setting the second voltage level to an initial maximum level or an initial minimum level; and a step of stepwise modifying the second voltage level according to the detection result, to make the control switch be able to be conductive in response to one of a maximum level or a minimum level of the sinusoidal wave.

16. The phase noise reduction method of claim 15, wherein the step of generating the sinusoidal wave by the crystal oscillator core circuit of the crystal oscillator comprises:

a step of providing a bias current of the crystal oscillator core circuit by one or more current units, to control the swing of the sinusoidal wave; and before the second voltage level is stepwise modified, a step of calibrating the bias current by a current calibration circuit to make the swing of the sinusoidal wave fall into a range between a tunable maximum level related to the initial maximum level and a tunable minimum level related to the initial minimum level.

17. The phase noise reduction method of claim 11, wherein the control switch comprises a diode coupled between the output terminal of the crystal oscillator core circuit and the second bias circuit.

18. The phase noise reduction method of claim 11, wherein the control switch comprises a P-type transistor, and a source terminal and a gate terminal of the P-type transistor are respectively coupled to the output terminal of the crystal oscillator core circuit and the second bias circuit.

19. The phase noise reduction method of claim 11, wherein the control switch comprises an N-type transistor, and a source terminal and a gate terminal of the N-type transistor are respectively coupled to the output terminal of the crystal oscillator core circuit and the second bias circuit.

* * * * *